United States Patent [19]
Gaibotti et al.

[11] Patent Number: 5,821,791
[45] Date of Patent: Oct. 13, 1998

[54] LOW-CONSUMPTION AND HIGH-DENSITY D FLIP-FLOP CIRCUIT IMPLEMENTATION PARTICULARLY FOR STANDARD CELL LIBRARIES

[75] Inventors: Maurizio Gaibotti, Cesano Maderno; Francesco Adduci, Milan, both of Italy

[73] Assignee: SGS-Thomson Microelectronics S.r.l., Agrate Brianza, Italy

[21] Appl. No.: 730,699

[22] Filed: Oct. 11, 1996

[30] Foreign Application Priority Data

Oct. 12, 1995 [EP] European Pat. Off. .............. 95830430

[51] Int. Cl.$^6$ ................................................. H03K 3/289
[52] U.S. Cl. ........................... 327/202; 327/203; 327/212
[58] Field of Search .................... 327/200–203, 327/211, 212, 214, 215, 218, 221–225

[56] References Cited

U.S. PATENT DOCUMENTS

| | | | |
|---|---|---|---|
| 3,578,984 | 5/1971 | Ryley ...................................... | 307/221 |
| 4,356,411 | 10/1982 | Suzuki et al. ........................ | 307/272 A |
| 5,036,217 | 7/1991 | Rollins et al. ........................ | 307/272.2 |
| 5,155,397 | 10/1992 | Fassino et al. ............................ | 327/55 |
| 5,245,223 | 9/1993 | Lim et al. ................................ | 327/202 |
| 5,384,493 | 1/1995 | Furuki ..................................... | 327/203 |
| 5,418,407 | 5/1995 | Frenkil ..................................... | 327/141 |
| 5,497,114 | 3/1996 | Shimozono et al. ..................... | 327/202 |
| 5,532,634 | 7/1996 | Sato ........................................ | 327/203 |

FOREIGN PATENT DOCUMENTS

| | | | |
|---|---|---|---|
| 55-19725 | 6/1980 | Japan ..................................... | 327/211 |
| 56-36220 | 4/1981 | Japan ..................................... | 327/208 |

OTHER PUBLICATIONS

European Search Report from European Patent Application 95830430.5, filed Oct. 12, 1995.

IEICE Transactions on Electronics, vol. E76–C, No. 5, May 1993 Tokyo JP, pp. 839–843, Seung–Moon Yoo, et al, "Variable VCC Design Techniques For Battery–Operated DRAM's".

Primary Examiner—Timothy P. Callahan
Assistant Examiner—T. T. Lam
Attorney, Agent, or Firm—Wolf, Greenfield & Sacks, P.C.

[57] ABSTRACT

A low-consumption and high-density D flip-flop circuit implementation, particularly for standard cell libraries, which comprises a master section and a slave section, is disclosed and claimed. The master section includes a master latch structure, a master coupling circuit which connects the master latch structure to one of two supply voltages, and an input coupling circuit for applying data to the flip-flop. The slave section includes a slave latch structure directly interposed between two supply voltages, and a slave coupling circuit which connects the slave latch structure to the master latch structure. The number of transistors required to realize the D flip-flop circuit implementation of the invention is minimized by enlarging the source areas of transistors in the input coupling circuit, which results in a large stray capacitance and insures optimum operation of the master latch. In addition, transistors in the slave latch structure have non-minimal gate lengths. Furthermore, a single clock signal is used to enable both master and slave sections. The ability to use a single clock signal without local regeneration coupled with minimizing the number of required components facilitates higher integrated circuit density and reduces power consumption.

27 Claims, 4 Drawing Sheets

LOW-CONSUMPTION AND HIGH-DENSITY D FLIP-FLOP CIRCUIT IMPLEMENTATION PARTICULARLY FOR STANDARD CELL LIBRARIES

BACKGROUND OF THE INVENTION

1. Field of the Invention

The present invention relates to the circuit implementation of a low-consumption and high-density D flip-flop, particularly for standard cell libraries.

2. Discussion of the Related Art

It is known that integrated circuits are currently designed by means of appropriate programs (tools) for automatic circuit configuration that take the individual circuit elements from libraries containing predefined elements.

It is thus evident that the optimization of the circuit to be produced depends both on the individual skill of the designer and on the optimization of the individual elements that make up the library.

In every device produced by means of automatic configuration programs, over 35–50% of the entire area of the device is assigned to a sequential part, which is advantageously provided by virtue of D-type registers, commonly known as D flip-flops.

The D flip-flop is a memory element that stores the data item acquired on the rising or falling edge of the clock signal.

Therefore, optimization of the implementation of the bistable element and of all its derivatives allows an improvement that is decisive for the entire device.

Optimization of a D-type bistable device must also affect the aspect of minimizing power loss to reduce the current consumption of the overall circuit.

In this regard, since the registers are driven by a sampling signal that is normally formed by the clock signal of the portion of the system having the highest switching frequency, use of two phases of the clock signal, with regeneration of the signal inside the cell, entails an increase in the area of the device, due to the presence of two invertors for generating the "normal" and "inverted" clock signals, an increase in current consumption, and the possibility of "skew" phenomena affecting the clock signal.

Local regeneration of the clock signal in fact entails a current consumption that is independent of the situation of the data item, that is to say, even when the data item stored in the bistable device does not change.

SUMMARY OF THE INVENTION

A purpose of the present invention is therefore to provide a low-consumption and high-density D flip-flop circuit implementation, particularly for standard cell libraries.

An object of the present invention is to provide a low-consumption and high-density D flip-flop circuit implementation that minimizes the number of active components.

Another object of the present invention is to provide a D flip-flop circuit implementation that enables minimization of the silicon area required for implementation.

Another object of the present invention is to provide a D flip-flop circuit implementation that enables use of a single-phase clock signal.

Another object of the present invention is to provide a D flip-flop circuit implementation that enables zero current consumption if a stable data item occurs at the input of the flip-flop.

Another object of the present invention is to provide a D flip-flop circuit implementation that is highly reliable, relatively easy to manufacture, and at competitive costs.

This purpose, these objects, and others which will become apparent hereinafter are achieved by a low-consumption and high-density D flip-flop circuit implementation, particularly for standard cell libraries, which includes a master section and a slave section. The master section has a master latch structure. The slave section has a slave latch structure. The master and slave sections are interposed between a power supply line and a ground line, each latch structure being formed by a first pair and a second pair of transistors. In the master latch structure, each of the first pair of transistors has a source terminal connected to the power supply line and is a P-channel MOS transistor. The second pair of transistors of the master latch structure has source terminals connected to respective drain terminals of an additional pair of transistors having the source terminals connected to the ground line. Same-phase clock signals are fed to the master section and to the slave section.

BRIEF DESCRIPTION OF THE DRAWINGS

Further characteristics and advantages of the invention will become apparent from a preferred but not exclusive embodiment of the D flip-flop circuit implementation according to the invention, illustrated by way of non-limiting example in the accompanying drawings, wherein.

DETAILED DESCRIPTION

Figure 1:
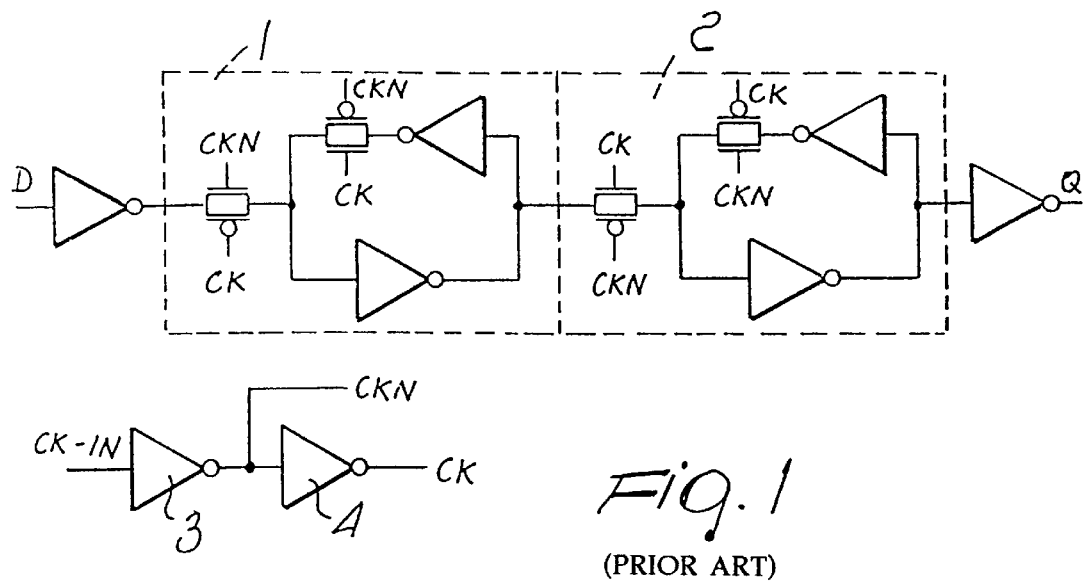
FIG. 1 is a circuit diagram of a conventional D flip-flop.

With reference to FIG. 1, the typical execution of a D flip-flop in CMOS technology is shown.

The illustrated circuit configuration can be divided into a master section 1 and into a slave section 2 of the D flip-flop.

The two invertors 3 and 4 have the purpose of internally regenerating the clock signal CK and also of generating the inverted clock signal CKN; these two signals, CK and CKN, are fed both to the master section 1 and to the slave section 2.

Figure 2:
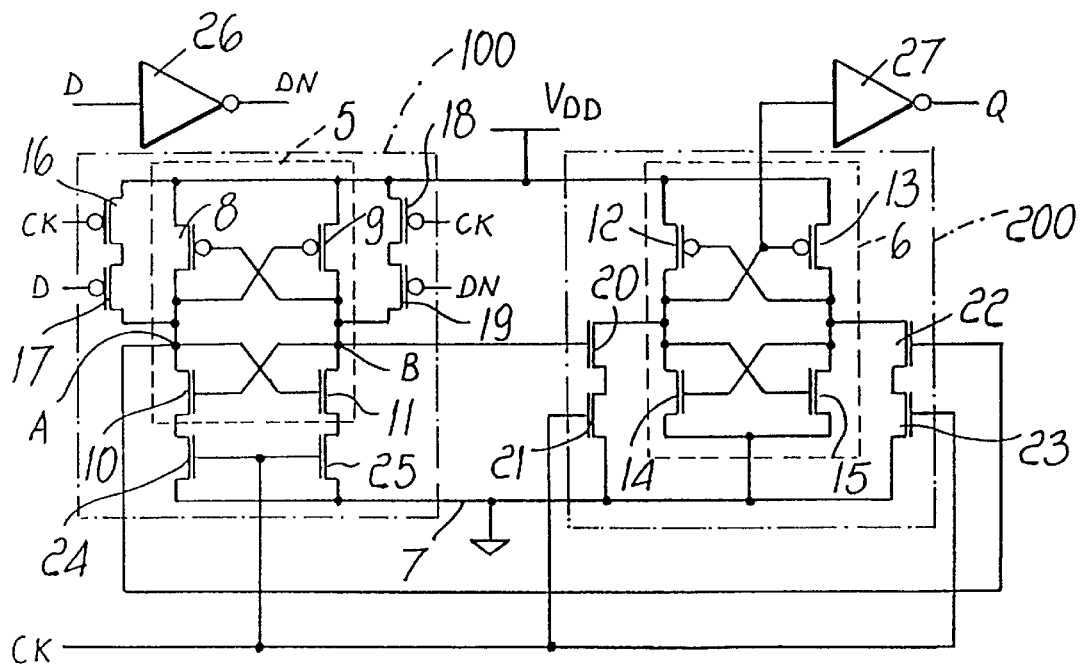
FIG. 2 is a circuit diagram of a D flip-flop according to a first embodiment of the present invention.

FIG. 2 is a view of a circuit implementation of a D flip-flop according to a first embodiment of the present invention.

The circuit configuration of this figure can again be divided into a master section 100 and a slave section 200.

The master section 100 includes a master latch structure 5 and the slave section 200 includes a slave latch structure 6, both sections connected between a power supply line $V_{DD}$ and a ground line 7.

Advantageously, each latch structure 5 and 6 includes two pairs of MOS transistors.

For the master latch structure 5, the first pair of transistors is formed by first and second MOS transistors of the P-channel type 8 and 9 having the respective source terminals connected to $V_{DD}$.

The second pair of transistors of the latch structure 5 is formed by third and fourth transistors of the N-channel type 10 and 11 having respective drain terminals connected respectively to drain terminals of the transistors 8 and 9. Source terminals of the transistors 10 and 11 are connected to the ground line 7 through N-channel MOS transistors 24 and 25 having gate terminals connected to the clock signal CK (the connections of the terminals of these last two MOS devices 24 and 25 are further described later).

The gate terminal of the transistor 8 is connected to the drain terminal of the transistor 9 and the gate terminal of the transistor 9 is connected to the drain terminal of the transistor 8.

For the second pair of transistors 10 and I 1, the gate terminal of the transistor 10 is formed to a line that connects the drain terminal of the transistor 9 and the drain terminal of the transistor 11.

Likewise, the gate terminal of the transistor 11 is connected to a line that connects the drain terminal of the transistor 8 and the drain terminal of the transistor 10.

The slave latch structure 6 has a configuration that is similar to that of the structure 5.

Therefore, for this structure 6 there is a first pair of P-channel MOS transistors that is formed by a fifth transistor 12 and by a sixth transistor 13 having respective source terminals connected to the power supply line $V_{DD}$ and having respective drain terminals connected respectively to drain terminals of seventh and eighth MOS N-channel transistors 14 and 15 that form a second pair of transistors of the structure 6.

The P-channel transistors 12 and 13 are "resistive" in that their gate terminals have non-minimal lengths.

Source terminals of the transistors 14 and 15 are connected to the ground line.

The gate terminals of the transistors 12 and 14 are connected to a line that connects the drain terminal of the transistor 13 and the drain terminal of the transistor 15.

Likewise, the gate terminals of the transistors 13 and 15 are connected to a line that connects the drain terminal of the transistor 12 and the drain terminal of the transistor 14.

Two additional pairs of P-channel MOS transistors 16–17 and 18–19 are connected respectively between the power supply line $V_{DD}$ and the nodes A and B. More particularly, a ninth transistor 16 and a tenth transistor 18 have source terminals that are connected to $V_{DD}$ and drain terminals that are respectively connected to the source terminals of an eleventh transistor 17 and of a twelfth transistor 19 having drain terminals respectively connected to the nodes A and B.

Likewise, for the latch structure 6, two additional pairs of transistors, formed respectively by a thirteenth transistor 20 and a fourteenth transistor 21, and by a fifteenth transistor 22 and a sixteenth transistor 23, are interposed respectively between the drain terminals of the transistors 12–14 and 13–15. More particularly, drain terminals of the transistors 20 and 22 are connected respectively between the drain terminals of the transistors 12–14 and 13–15.

Source terminals of the transistors 21 and 23 are connected to the ground line 7. Gate terminals of the transistors 20 and 22 are respectively connected to the node B and to the node A.

Finally, a seventeenth MOS N-channel transistor 24 and an eighteenth MOS N-channel transistor 25, as mentioned earlier, are connected, by virtue of their drain terminals, respectively to the source terminals of transistors 10 and 11, and by virtue of their source terminals to the ground line 7. Gate terminals of the transistors 24 and 25 are connected to one another.

A clock signal CK of the same phase is fed to the gate terminals of the transistors 16, 18, is 21, 23, and 24–25.

An inverter 26 provides, as an output, an inverted data item DN based on a data item D.

The data item D and the inverted data item DN are fed respectively to the gate terminals of the transistors 17 and 19.

Finally, an inverter 27 is connected to the gate terminal of the transistor 13 and produces as an output, the signal Q, which forms the output of the D flip-flop circuit implementation according to a first embodiment of the present invention.

Figure 3:
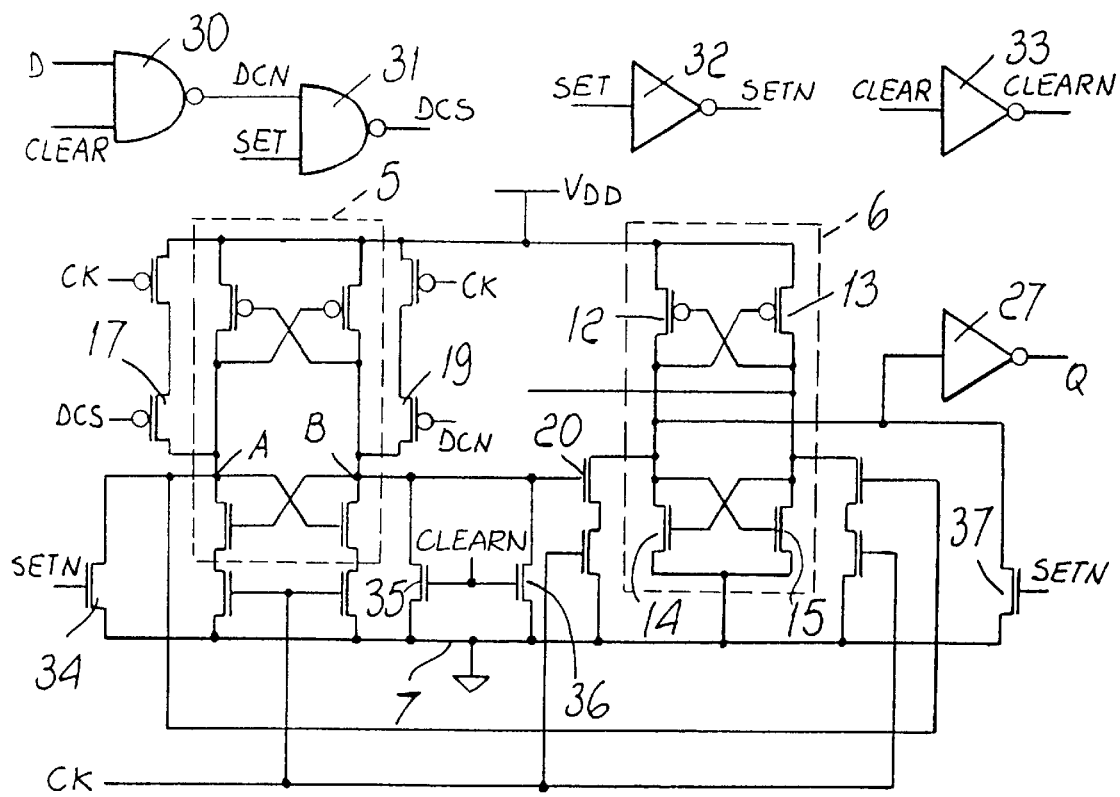
FIG. 3 is a circuit diagram of an application of a D flip-flop according to the first embodiment of the present invention.

FIG. 3 is a view of an application of the D flip-flop circuit implementation according to the invention if SET and CLEAR signals are present. In FIG. 3 and in all subsequent Figures, the same reference numerals have been used to designate elements that are identical to those of FIG. 2. In the interest of easy comprehension, it has been thought appropriate to designate with reference numerals in particular the elements that differentiate the circuit solution of FIG. 3 with respect to that of FIG. 2.

Therefore, a nineteenth N-channel MOS device 34 is connected, by virtue of its drain terminal, to the node A of the master latch structure 5 and, by virtue of its source terminal, to the ground line 7.

A pair of N-channel MOS transistors is formed by a twentieth transistor 35 and by a twenty-first transistor 36 having respective gate terminals that are common-connected and being connected to the ground line 7 by virtue of their source terminals. A drain terminal of the transistor 35 is connected to the node B.

A drain terminal of the transistor 36 is connected to the line that connects the drain terminal of the transistor 13 to the drain terminal of the transistor 15 of the slave structure 6.

Finally, a twenty-second transistor 37 is connected to the ground line 7 by virtue of its source terminal, and to the line that connects the drain terminal of the transistor 12 to the drain terminal of the transistor 14 by virtue of its drain terminal. The inverter 27 that produces the signal Q, as an output, is connected to the drain terminal of the transistor 37.

Two NAND gates 30 and 31, each having two inputs, are connected in series. The inputs of the NAND gate 30 are the D and CLEAR signals, and its output is the DCN signal, which forms one of the two inputs of the second NAND gate 31. The other input of the second NAND gate 31 is the SET signal. The output of the second NAND gate 31 is the DCS signal. Therefore, the cascade connection of the two NAND gates 30 and 31 produces an AND operation of the signals D, CLEAR, and SET.

An inverter 32 has the SET signal as an input and the inverted SET signal SETN, as an output.

Another inverter 33 has the CLEAR signal as an input and the inverted CLEAR signal, CLEARN, as an output.

The DCS signal is fed to the gate terminal of the transistor 17, differently from the case of FIG. 2, in which the D signal was fed to this transistor.

The SETN signal is connected to the gate terminals of the transistors 34 and 37, whereas the CLEARN signal biases the gate terminals of the transistors 35 and 36.

Finally, the DCN signal is connected to the gate terminal of the transistor 19.

Figure 4:
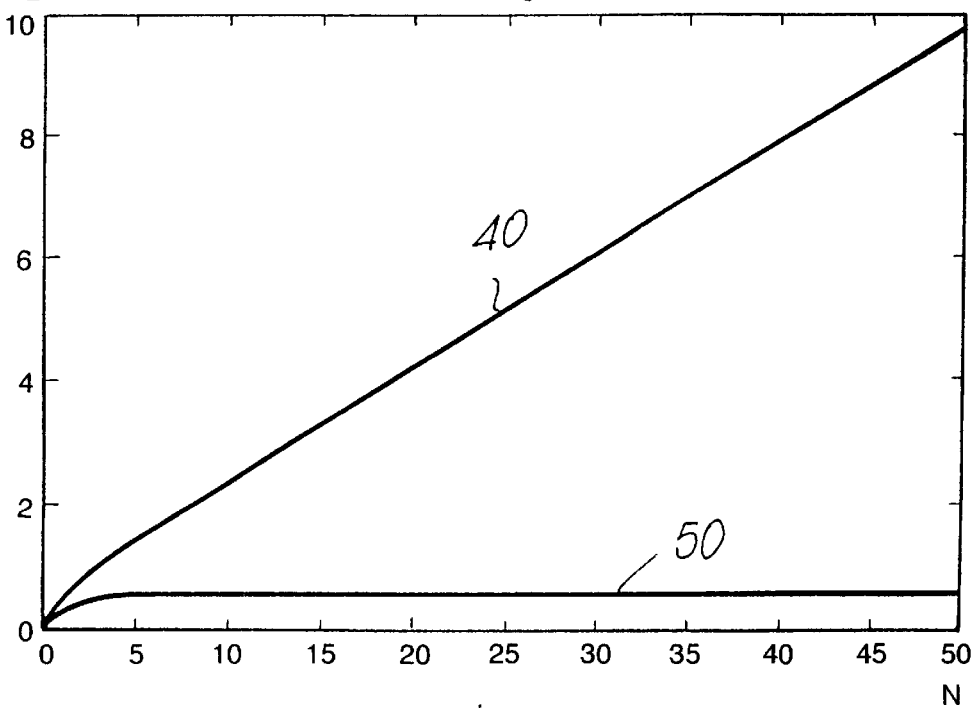
FIG. 4 is a chart comparing current consumption for a synchronous counter with N stages according to the known art and according to the first embodiment of the present invention.

FIG. 4 is a chart comparing the current consumption of a binary counter with N stages in a standard configuration and of a counter produced according to the circuit configuration shown in FIG. 2. In this chart, the axis of the abscissa plots the number of stages of the binary counter, whereas the axis of the ordinate plots the current consumption, expressed as $\mu A/MHZ$.

In the chart, the line 40 plots the current consumption of the counter according to the standard circuit solution; it is evident that current consumption is proportional to the number N of stages.

The line 50 plots current consumption if the D flip-flop circuit implementation according to the invention is applied. Here, current consumption has a limited growth as the number N of stages of the counter increases.

Figure 5:
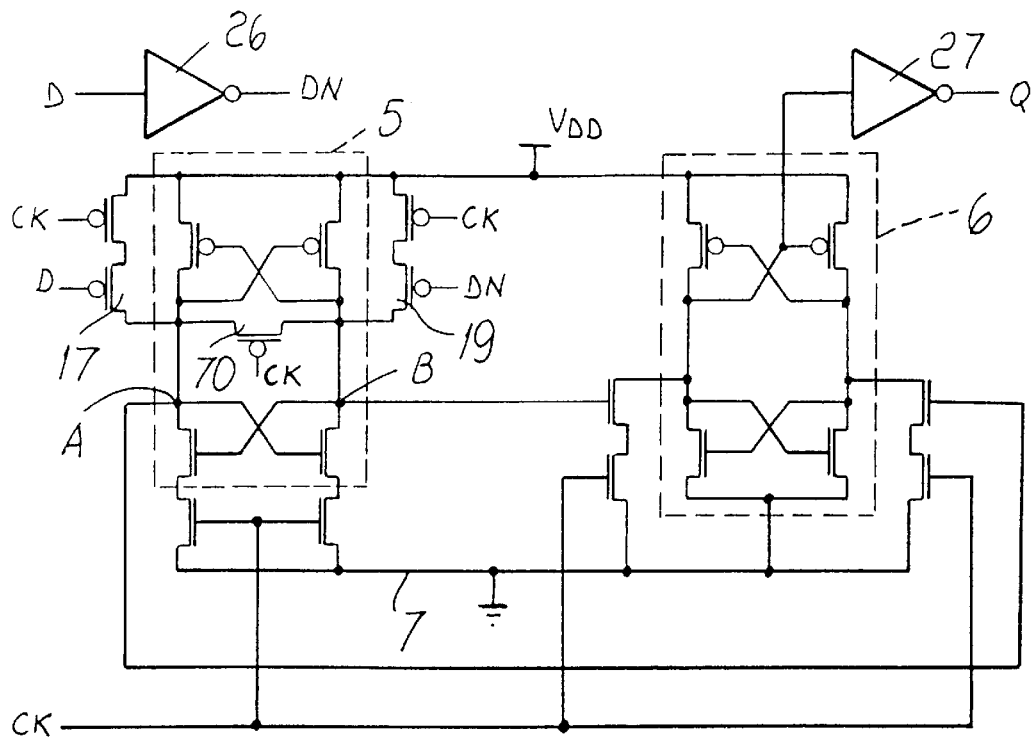
FIG. 5 is a circuit diagram of a D flip-flop according to a second embodiment of the present invention.

FIG. 5 is a view of a D flip-flop according to a second embodiment of the invention which is suitable if the noise sensitivity of the device is important.

An additional MOS transistor 70 of the P-channel type is introduced in this second embodiment and is interposed between the drain terminals of the transistors 17 and 19 that belong to the master latch structure 5.

The clock signal CK is fed to the gate terminal of the transistor 70.

Figure 6:
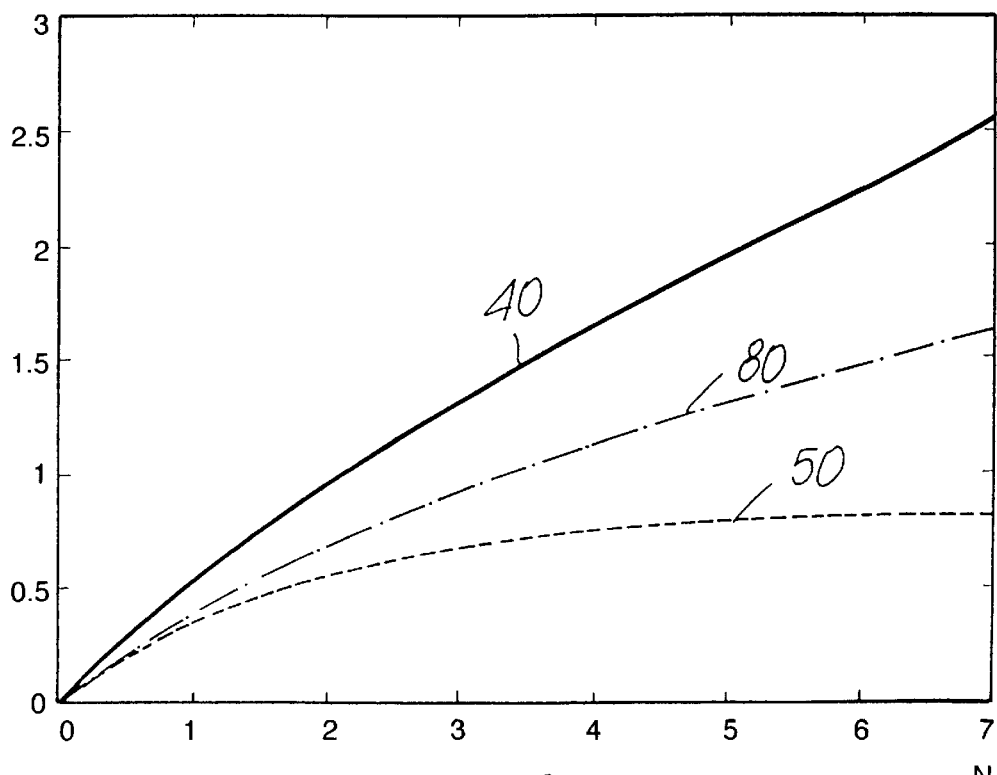
FIG. 6 is a chart comparing current consumption for a synchronous counter according to the known art and according to the first and second embodiments the present invention.

FIG. 6 is a chart comparing the current consumption performance of a standard D flip-flop circuit implementation, and performances of circuit implementations according to the first and second embodiments.

As in the chart of FIG. 4, the abscissas plot the number N of stages, whereas the ordinate plots current consumption (in $\mu A/MHZ$). The difference between these two charts is the presence, in the chart of FIG. 6, of an additional curve 80 that plots the current consumption of the circuit implementation according to the second embodiment of the invention.

Figure 7:
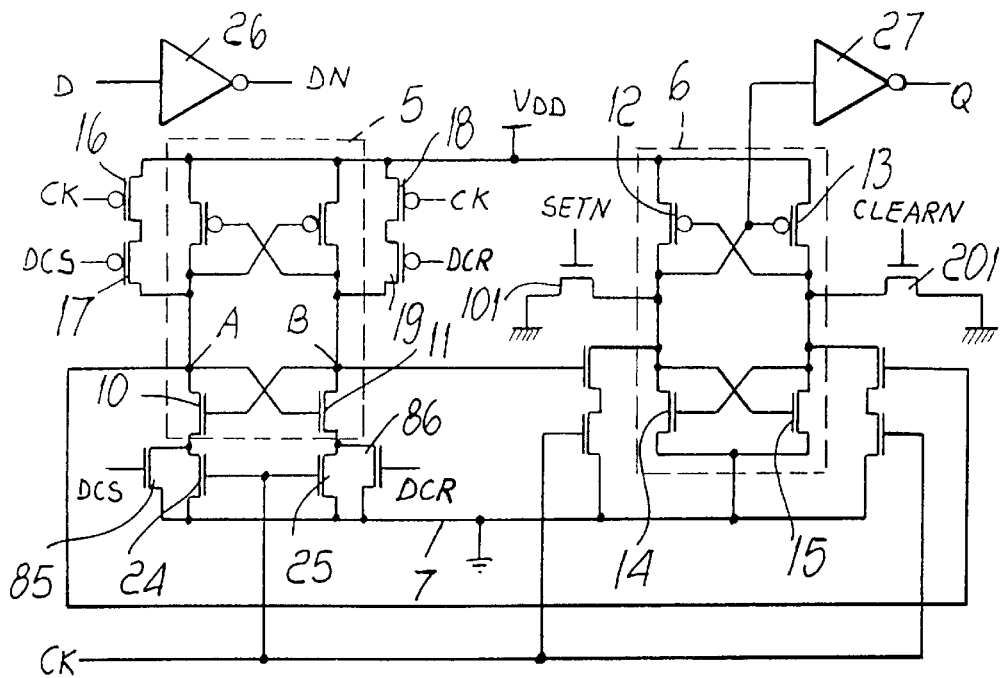
FIG. 7 is a circuit diagram of a D flip-flop according to a third embodiment of the present invention.

FIG. 7 is a circuit diagram of a D flip-flop circuit implementation according to a third embodiment of the invention, again in the case in which noise sensitivity is a factor to be taken into account.

With this problem in mind, the circuit solution of FIG. 2 has been modified as shown in FIG. 7, by adding two N-channel MOS transistors 85 and 86 at the master latch structure 5. More particularly, the transistor 85 has a drain terminal connected to the line that connects the source terminal of the transistor 10 and the drain terminal of the transistor 24. Likewise, the transistor 86 has a drain terminal connected to the line that connects the source terminal of the transistor 11 and the drain terminal of the transistor 25. The gate terminals of the transistors 85 and 86 are respectively driven by the DCS and DCR signals, which are provided by the NAND gates 30 and 31, with an added NOT gate 102; these gates are also shown in FIG. 7. Two further N-channel MOS transistors 101 and 201 are respectively connected with their drain terminals to the drain terminals of MOS transistors 12,14 and 13,15, as shown in FIG. 7.

The source terminals of MOS transistors 100 and 201 are connected to ground potential.

A SETN signal is fed to the gate terminal of the transistor 101, and a CLEARN signal is fed to the gate terminal of the transistor 201.

The embodiment shown in FIG. 7 has, differently from the embodiments of FIGS. 2 and 5, a DCS signal fed to the gate of the transistor 17 and the DCR signal fed to the gate of the transistor 19.

A DCR signal is also fed to the gate of the transistor 86.

Figure 8:
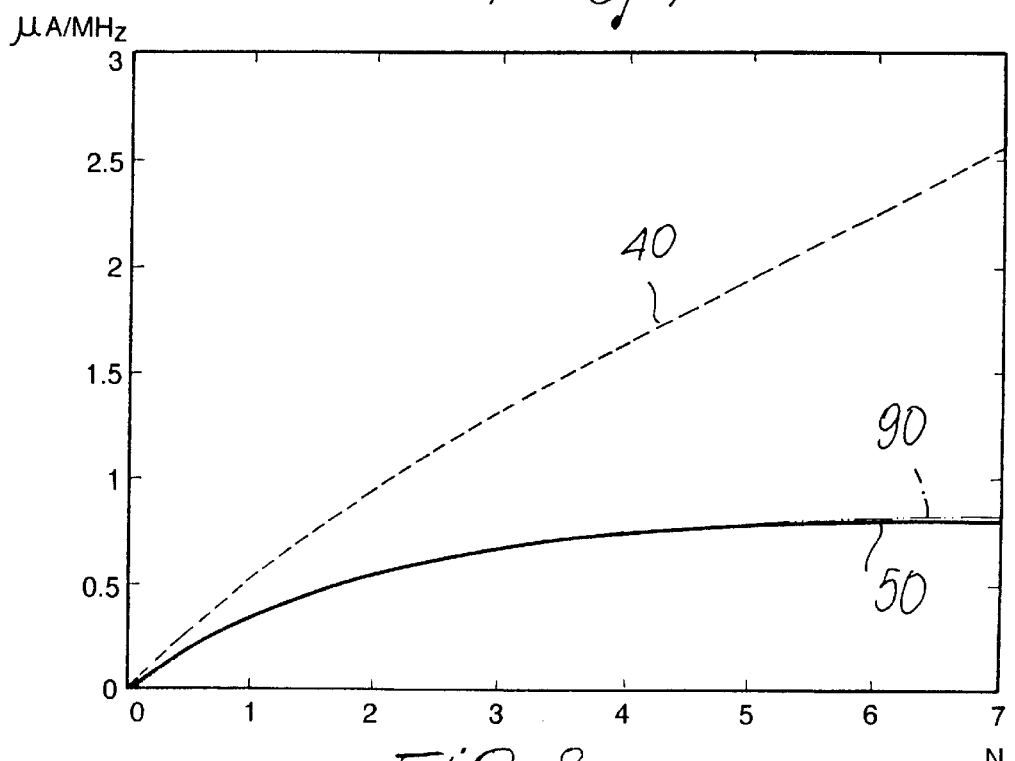
FIG. 8 is a chart comparing current consumption of a synchronous counter according to the known art and according to the first and third embodiments of the present invention.

FIG. 8 is a chart, similar to the charts of FIGS. 4 and 6, illustrating a comparison of current consumptions of the standard D flip-flop configuration, the configuration according to the first embodiment shown in FIG. 2, and in the circuit solution of FIG. 2, modified as shown in FIG. 7.

In this chart, the curve 40 again plots the standard solution, the curve 50 plots the solution according to the invention shown in FIG. 2, and the curve 90 plots the modified solution shown in FIG. 8. In this case it is evident that the curve 90 practically overlaps the curve 50.

With reference to FIG. 2, the operation of the D flip-flop circuit implementation according to the present invention is as follows.

In the master section 100, the transistors 24 and 25 are disabled during the low phase of the clock signal CK the master latch 5 is disconnected from the ground. The data items D and DN that are present respectively on the gate terminals of the transistors 17 and 19 are stored in the master latch structure 5 during the rising edge of the clock signal CK. These transistors 17 and 19 respectively provide the stored data items to the gate terminals of the transistors 22 and 20.

The slave section 200 then admits the data items of the master section 100 during the rising edge of the clock signal CK by virtue of the transistors 20, 21, 22, and 23.

In order to use a single phase of the clock signal CK, the data item in the master section 5 is stored by means of the two P-channel MOS transistors 8 and 9 and N-channel MOS transistors 10 and 11 on a rising edge of the clock signal, and simultaneously, by virtue of the four N-channel transistors 20, 21 and 22, 23, the slave section 200 is coupled to the master section 100, thus allowing the slave section 200 to remain coupled until the next transition of the clock signal CK.

Therefore, at the instant of transition of the clock signal CK from low to high, the master latch structure 5 is "closed" so as to retain the last data item that is present; the resistance opposed by the branch in which both transistors are on (i.e., either the branch with the transistors 16 and 17 or the branch with the transistors 18 and 19) forces stabilization of the main latch structure 5 in a manner that matches the data item D that is present at the gate terminals of the transistors 17 and 19.

Even if a very fast transition of the clock signal CK occurs, the capacitive charge that is present on the branch in which both transistors are on causes the master latch structure 5 to store the data item D correctly.

For this to occur, the clock signal CK must be fed to the gate terminals of the transistors 16 and 18 to avoid unwanted couplings of the transitions of the signal CK with the output nodes of the master latch structure 5.

As mentioned earlier, the slave section 200 thus has the data item stored in the master latch structure 5 at the gate terminals of the transistors 20 and 22 and transfers the data item to the slave latch structure 6, which holds the data items, because it is stable, throughout the low phase of the clock signal CK.

During the low phase of the clock signal CK, the slave section 200 is uncoupled from the master section 100 by switching off the transistors 21 and 23.

Therefore, it is possible to use a single clock signal CK both for the master section 100 and for the slave section 200, avoiding the need for local clock regeneration, which entails current consumption independently of changes in the data item D.

Advantageously, for optimum operation of the D flip-flop circuit implementation according to the invention, the source areas of the transistors 17 and 19 are appropriately provided with large dimensions resulting in a large stray capacitance with respect to ground.

FIG. 3 illustrates the application of the D flip-flop circuit implementation to a flip-flop with SET and CLEAR setting and resetting signals.

In this case, the structure of FIG. 2 is maintained, with the addition of a few transistors (i.e., transistors 34, 35, 36, and 37).

The low active CLEAR signal has the purpose of resetting the output Q of the D flip-flop to zero.

The low active SET signal has the purpose of raising the output Q of the flip-flop to a high level.

FIG. 4 shows that the current consumption of a counter with N stages is proportional to the number N of the stages for a conventional D flip-flop circuit embodiment, whereas for the implementation according to the invention, current consumption is limited as the number N of stages increases.

If there are leakage problems, or if the D flip-flops are used for frequencies that are very different from one another, it is necessary to consider the noise sensitivity of the circuit implementation. Noise sensitivity is due to the fact that one of the two nodes A and B of the circuit floats, during the low phase of the clock signal CK, due to the switching-off of the corresponding transistor 17 or 19.

In fact, during the low phase of the clock signal CK, the two P-channel MOS transistors 16 and 18 are short circuits. However, there is a node (A or B) that is certainly at the supply voltage $V_{DD}$, whereas the other node is not forced to $V_{DD}$ or to the ground by any resistive path. Therefore one of the two nodes remains floating, that is to say, it is not set to any level, and this makes it sensitive to potential noise.

In order to obviate this drawback, if it is essential to control the noise sensitivity of the device, it is possible to follow two alternatives, which are provided by modifying the circuit implementation of FIG. 2.

In a first alternative embodiment (i.e., the second embodiment), shown in FIG. 5, a transistor 70 is added which has the purpose of bringing the nodes A and B to the same level. The transistor 70 is advantageously a P-channel MOS transistor, which is interposed between the drain terminals of the transistors 17 and 19 and in which the clock signal CK is fed to its gate terminal.

In this manner, the two nodes A and B are set to the same value just before evaluation of the data item, and this prevents unwanted bootstrapping effects caused by noise of adjacent signals or by the switching-off of one of the two transistors 17 or 19.

However, as a consequence, even in the presence of a constant data item, at each transition of the clock signal CK, both nodes A and B are charged at the supply voltage $V_{DD}$ and then, during the coupling of the master latch structure that occurs on the rising edge of the signal CK, one of the two nodes (always the same one, if the data item does not change) is discharged to the ground.

In terms of current consumption, this modification is more expensive than the circuit embodiment of FIG. 2. The curve 40 in the chart of FIG. 6 in fact plots the current consumption of the conventional D flip-flop circuit embodiment, the curve 50 plots consumption for the embodiment according to the invention shown in FIG. 2, and the curve 80 plots consumption in the case of the solution of FIG. 5, which is in any case lower than that of the conventional solution.

In choosing the most appropriate D flip-flop implementation, it should be determined whether minimizing noise sensitivity or current consumption of the device is more important.

The second alternative embodiment (i.e., the third embodiment), which is adopted to take into account the noise sensitivity of the device, entails the addition of two MOS transistors 85 and 86, advantageously of the N-channel type, in the master section 100, with the SET and CLEAR functions.

These two transistors 85 and 86 have therefore the purpose of coupling one node of the master latch structure 5 to the ground potential depending on the input data item, independently of the clock signal CK.

On the rising edge of the clock signal CK, the data item that is present is frozen as in the solution of FIG. 2. Additionally, this embodiment preserves the basic aspect of zero consumption in the presence of a constant data item, differently from the embodiment shown in FIG. 5.

The chart of FIG. 8 shows the curve 90 of the current consumption of the solution of FIG. 7, compared with the curve 50 of the current consumption of the solution of FIG. 2 and with the curve 40 plotting the consumption of the conventional solution.

In practice, it has been observed that the D flip-flop circuit implementation according to the invention fully achieves the intended purpose, since it enables optimization of the D flip-flop with regard to current consumption, thus minimizing the power lost in this element.

Furthermore, the circuit implementation according to the invention minimizes the possibility of a "skew" of the clock signal CK inside the circuit, using a single signal phase without requiring its regeneration inside the cell.

The lack of local regeneration of the clock signal CK inside the cell provides a zero current consumption situation if the data item is stable.

Finally, the lack of local regeneration enables a reduction in the number of transistors required for the implementation of the D flip-flop according to the invention and therefore a consequent reduction in the area of the device and in the corresponding production costs.

Where technical features mentioned in any claim are followed by reference signs, those reference signs have been included for the sole purpose of increasing the intelligibility of the claims and accordingly such reference signs do not have any limiting effect on the interpretation of each element identified by way of example by such reference signs.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A D flip-flop circuit, comprising:
   a first latch structure and a second latch structure, each having:

a first pair of transistors, each transistor of said first pair of transistors being of a first type, having a gate terminal connected to a respective drain terminal of another transistor of said first pair of transistors; and a second pair of transistors, each transistor of said second pair of transistors being of a second type, having a gate terminal connected to a respective drain terminal of another transistor of said second pair of transistors and wherein each drain terminal of said first pair of transistors is connected to a respective drain terminal of said second pair of transistors;

a master section interposed between a first voltage potential and a second voltage potential including:

said first latch structure, wherein said first pair of transistors has source terminals connected to said first voltage potential;

a master latch coupler having a third pair of transistors, each transistor of said third pair of transistors being of said second type, having a drain terminal connected to a respective source terminal of said second pair of transistors of said first latch structure, a source terminal connected to said second voltage potential and a gate terminal that receives a single clock signal; and an input coupler having two pair of transistors, each transistor of each pair of transistors being of said first type, each pair of transistors including a first transistor and a second transistor connected in series, wherein a source terminal of said first transistor is connected to said first voltage potential, a drain terminal of said second transistor is connected to a respective drain terminal of said first pair of transistors of said first latch structure, said second transistor has a large source area, whereby a stray capacitance with respect to said second voltage potential at a source terminal of said second transistor is greater than a capacitance at the respective drain terminal of said first pair of transistors of said first latch structure, and wherein a gate terminal of said first transistor receives said single clock signal, and a gate terminal of one of said second transistors receives a logic level input signal and a gate terminal of another of said second transistors receives a complement of said logic level input signal; and a slave section interposed between said first voltage potential and said second voltage potential including:

said second latch structure wherein said first pair of transistors has source terminals connected to said first voltage potential and said second pair of transistors has source terminals connected to said second voltage potential; and a slave coupler having two pair of transistors, each transistor of each pair of transistors being of said second type, each pair of transistors being series connected between said second voltage potential and a respective drain terminal of said first pair of transistors of said second latch structure, wherein a gate terminal of one transistor in each pair of transistors is connected to a respective drain terminal of said first pair of transistors of said first latch structure, and a gate terminal of another transistor in each pair of transistors receives said single clock signal.

2. The D flip-flop circuit according to claim 1, wherein:
said first type is a P-channel MOS transistor;
said second type is an N-channel MOS transistor;
said first voltage potential is a power supply line; and
said second voltage potential is a ground potential.

3. The D flip-flop circuit according to claim 1, further including a coupling transistor interposed between the respective drain terminals of said first pair of transistors of said first latch structure.

4. The D flip-flop circuit according to claim 3, wherein said coupling transistor is a P-channel MOS transistor.

5. The D flip-flop circuit according to claim 4, wherein a gate terminal of said coupling transistor receives said single clock signal.

6. The D flip-flop circuit according to claim 1, wherein the master section further comprises:

a DCS transistor of said second type having a source terminal connected to said second voltage potential and a drain terminal connected to one drain terminals of said third pair of transistors of said master section; and a DCR transistor of said second type having a source terminal connected to said second voltage potential and a drain terminal connected to another drain terminal of said third pair of transistors of said master section.

7. The D flip-flop circuit according to claim 1, wherein the slave section further comprises:

a set transistor of said second type having a drain terminal connected to one drain terminal of said first pair of transistors of said second latch structure and a source terminal connected to said second voltage potential; and a clear transistor of said second type having a drain terminal connected to another drain terminal of said first pair of transistors of said second latch structure and a source terminal connected to said second voltage potential.

8. The D flip-flop circuit according to claim 7, wherein:
the set transistor includes a gate terminal which receives a complement of a set signal; and
the clear transistor includes a gate terminal which receives a complement of a clear signal.

9. The A D flip-flop circuit, comprising:
a first latch structure and a second latch structure, each having:

a first pair of transistors, each transistor of said first pair of transistors being of a first type, having a gate terminal connected to a respective drain terminal of another transistor of said first pair of transistors; and a second pair of transistors, each transistor of said second pair of transistors being of a second type, having a gate terminal connected to a respective drain terminal of another transistor of said second pair of transistors and wherein each drain terminal of said first pair of transistors is connected to a respective drain terminal of said second pair of transistors;

a master section interposed between a first voltage potential and a second voltage potential including:

said first latch structure, wherein said first pair of transistors has source terminals connected to said first voltage potential;

a master latch coupler having a third pair of transistors, each transistor of said third pair of transistors being of said second type, having a drain terminal connected to a respective source terminal of said second pair of transistors of said first latch structure, a source terminal connected to said second voltage potential and a gate terminal that receives a single clock signal; and an input coupler having two pair of transistors, each transistor of each pair of transistors being of said first type, each pair of transistors including a first transistor and a second transistor connected in series, wherein a source terminal of said first transistor is connected to said first voltage potential, a drain terminal of said second transistor is connected to a respective drain terminal of said first pair of transistors of said first latch structure, and wherein a gate terminal of said first transistor receives said single clock signal, and a gate terminal of one of said second transistors receives a logic level input signal and a gate terminal of another of said second transistors receives a complement of said logic level input signal;

a slave section interposed between said first voltage potential and said second voltage potential including:
  said second latch structure wherein said first pair of transistors has source terminals connected to said first voltage potential and said second pair of transistors has source terminals connected to said second voltage potential; and
  a slave coupler having two pair of transistors, each transistor of each pair of transistors being of said second type, each pair of transistors being series connected between said second voltage potential and a respective drain terminal of said first pair of transistors of said second latch structure, wherein a gate terminal of one transistor in each pair of transistors is connected to a respective drain terminal of said first pair of transistors of said first latch structure, and a gate terminal of another transistor in each pair of transistors receives said single clock signal;
  a first set transistor of said second type having a source terminal connected to said second voltage potential, and a drain terminal connected to a first drain terminal of said first pair of transistors of said first latch structure; and
  a second set transistor of said second type having a source terminal connected to said second voltage potential, and a drain terminal connected to a first drain terminal of said first pair of transistors of said second latch structure.

10. The D flip-flop circuit according to claim 9, wherein:
each of the first and second set transistors further includes a gate terminal that receives a complement of a set signal;
each gate terminal of said second transistors in said input coupler respectively receives, instead of said logic level input signal and said complement of said logic level input signal, a first data signal resulting from a first logic NAND operation on said logic level input signal and a clear signal, and a second data signal resulting from a second logic NAND operation on said first data signal and said set signal.

11. The A D flip-flop circuit, comprising:
a first latch structure and a second latch structure, each having:
  a first pair of transistors, each transistor of said first pair of transistors being of a first type, having a gate terminal connected to a respective drain terminal of another transistor of said first pair of transistors; and
  a second pair of transistors, each transistor of said second pair of transistors being of a second type, having a gate terminal connected to a respective drain terminal of another transistor of said second pair of transistors and wherein each drain terminal of said first pair of transistors is connected to a respective drain terminal of said second pair of transistors;

a master section interposed between a first voltage potential and a second voltage potential including:
  said first latch structure, wherein said first pair of transistors has source terminals connected to said first voltage potential;
  a master latch coupler having a third pair of transistors, each transistor of said third pair of transistors being of said second type, having a drain terminal connected to a respective source terminal of said second pair of transistors of said first latch structure, a source terminal connected to said second voltage potential and a gate terminal that receives a single clock signal; and
  an input coupler having two pair of transistors, each transistor of each pair of transistors being of said first type, each pair of transistors including a first transistor and a second transistor connected in series, wherein a source terminal of said first transistor is connected to said first voltage potential, a drain terminal of said second transistor is connected to a respective drain terminal of said first pair of transistors of said first latch structure, and wherein a gate terminal of said first transistor receives said single clock signal, and a gate terminal of one of said second transistors receives a logic level input signal and a gate terminal of another of said second transistors receives a complement of said logic level input signal;

a slave section interposed between said first voltage potential and said second voltage potential including:
  said second latch structure wherein said first pair of transistors has source terminals connected to said first voltage potential and said second pair of transistors has source terminals connected to said second voltage potential; and
  a slave coupler having two pair of transistors, each transistor of each pair of transistors being of said second type, each pair of transistors being series connected between said second voltage potential and a respective drain terminal of said first pair of transistors of said second latch structure, wherein a gate terminal of one transistor in each pair of transistors is connected to a respective drain terminal of said first pair of transistors of said first latch structure, and a gate terminal of another transistor in each pair of transistors receives said single clock signal;
  a first clear transistor of said second type having a source terminal connected to said second voltage potential, and a drain terminal connected to a second drain terminal of said first pair of transistors of said first latch structure; and
  a second clear transistor of said second type having a source terminal connected to said second voltage potential, and a drain terminal connected to a second drain terminal of said first pair of transistors of said second latch structure.

12. The D flip-flop circuit according to claim 11, wherein each of the first and second clear transistors further includes a gate terminal that receives a complement of a clear signal.

13. A D flip-flop circuit, comprising:
a first latch structure and a second latch structure, each having:
  a first pair of transistors each transistor of said first pair of transistors being of a first type, having a gate terminal connected to a respective drain terminal of another transistor of said first pair of transistors; and a second pair of transistors, each transistor of said second pair of transistors being of a second type, having a gate terminal connected to a respective drain terminal of another transistor of said second pair of transistors and wherein each drain terminal of said first pair of transistors is connected to a respective drain terminal of said second pair of transistors;

a master section interposed between a first voltage potential and a second voltage potential including:

said first latch structure, wherein said first pair of transistors has source terminals connected to said first voltage potential;

a master latch coupler having a third pair of transistors, each transistor of said third pair of transistors being of said second type, having a drain terminal connected to a respective source terminal of said second pair of transistors of said first latch structure, a source terminal connected to said second voltage potential and a gate terminal that receives a single clock signal;

an input coupler having two pair of transistors, each transistor of each pair of transistors being of said first type, each pair of transistors including a first transistor and a second transistor connected in series, wherein a source terminal of said first transistor is connected to said first voltage potential, a drain terminal of said second transistor is connected to a respective drain terminal of said first pair of transistors of said first latch structure, and wherein a gate terminal of said first transistor receives said single clock signal, and a gate terminal of one of said second transistors receives a logic level input signal and a gate terminal of another of said second transistors receives a complement of said logic level input signal;

a DCS transistor of said second type having a source terminal connected to said second voltage potential and a drain terminal connected to one drain terminal of said third pair of transistors of said master section; and a DCR transistor of said second type having a source terminal connected to said second voltage potential and a drain terminal connected to another drain terminal of said third pair of transistors of said master section, wherein a gate terminal of said DCS transistor and said gate terminal of one of said second transistors in said input coupler each receive a second logic signal derived by a series of a first and a second logic NAND operation, a first logic signal resulting from said first logic NAND operation on said logic level input signal and a clear signal, and said second logic signal resulting from said second logic NAND operation on said first logic signal and a set signal, and a gate terminal of said DCR transistor and said gate terminal of another of said second transistors in said input coupler each receive a complement of said second logic signal; and a slave section interposed between said first voltage potential and said second voltage potential including:

said second latch structure wherein said first pair of transistors has source terminals connected to said first voltage potential and said second pair of transistors has source terminals connected to said second voltage potential; and a slave coupler having two pair of transistors, each transistor of each pair of transistors being of said second type, each pair of transistors being series connected between said second voltage potential and a respective drain terminal of said first pair of transistors of said second latch structure, wherein a gate terminal of one transistor in each pair of transistors is connected to a respective drain terminal of said first pair of transistors of said first latch structure, and a gate terminal of another transistor in each pair of transistors receives said single clock signal.

14. A D flip-flop circuit, comprising:

a first voltage potential and a second voltage potential;

a master section that includes:

a master latch structure, coupled to the first voltage potential, including not more than four transistors, that stores a data item in response to a first transition of a clock signal between a first value and a second value;

an input coupler circuit, coupled to the first voltage potential, including not more than four transistors, which couples the data item to the master latch structure when the clock signal equals the first value; and a connection circuit, coupled between the master latch structure and the second voltage potential, including not more than two transistors, that electrically connects the master latch structure to the second voltage potential when the clock signal equals the second value such that the data item is stored in the master latch structure; and a slave section that includes:

a slave latch structure, directly coupled to both the first voltage potential and the second voltage potential, including not more than four transistors, that stores the data item in response to a second transition of the clock signal between the second value and the first value; and a slave coupler, coupled to the second voltage potential including not more than four transistors, which couples the data item stored in the master latch structure to the slave latch structure when the clock signal equals the second value.

15. The D flip-flop circuit according to claim 14, wherein:

both the master latch structure and the slave latch structure include a pair of cross-coupled CMOS logic inverters;

the first voltage potential is a power supply line;

the second voltage potential is a ground line;

the first value is a logic low level;

the second value is a logic high level; and a logic output obtained from the slave latch structure can be predetermined to either the logic low level or the logic high level by a set circuit and a clear circuit, both the set circuit and the clear circuit connected to both the master latch structure and the slave latch structure.

16. The D flip-flop circuit according to claim 14, further comprising:

at least one transistor connected to the master latch structure, and having a gate terminal that receives one of either a logic signal, based on the data item, or the clock signal such that noise sensitivity of the D flip-flop circuit is reduced.

17. A D flip-flop circuit, comprising:

a first voltage potential and a second voltage potential;

a master section that includes:

master latch means, coupled to the first voltage potential, for storing a data item in response to a first transition of a clock signal between a first value and a second value;

input coupling means, coupled to the first voltage potential, including not more than four transistors, for coupling the data item to the master latch means when the clock signal equals the first value; and connection means, coupled between the master latch means and the second voltage potential, including not more than two transistors, for electrically connecting the master latch means to the second voltage potential when the clock signal equals the second value such that the data item is stored in the master latch means; and a slave section that includes:

slave latch means, directly coupled to both the first voltage potential and the second voltage potential, including not more than four transistors for storing the data item in response to a second transition of the clock signal between the second value and the first value; and slave coupling means, coupled to the second voltage potential, including not more than four transistors, for coupling the data item stored in the master latch means to the slave latch means when the clock signal equals the second value.

18. The D flip-flop circuit according to claim 17, wherein:

both the master latch means and the slave latch means include a pair of cross-coupled CMOS logic inverters;

the first voltage potential is a power supply line;

the second voltage potential is a ground line;

the first value is a logic low level;

the second value is a logic high level, and wherein the D flip-flop circuit further comprises:

set means connected to both the master latch means and the slave latch means for predetermining a logic output obtained from the slave latch means; and clear means connected to both the master latch means and the slave latch means for predetermining the complement of the logic output obtained from the slave latch means.

19. The D flip-flop circuit according to claim 17, further comprising:

noise reducing means, connected to the master latch means, for reducing noise sensitivity of the D flip-flop circuit in response to one of either a logic signal, based on the data item, or the clock signal.

20. A method for acquiring a data item, comprising the steps of:

storing, in a first structure, a data item in response to a first transition of a clock signal between a first value and a second value;

coupling the data item to the first structure when the clock signal equals the first value;

electrically connecting the first structure between a power supply line and a ground line when the clock signal equals the second value such that the data item is admitted into the first structure;

storing, in a second structure continually connected between the power supply line and the ground line, the data item in response to a second transition of the clock signal between the second value and the first value; and coupling the data item stored in the first structure to the second structure when the clock signal equals the second value.

21. The method of claim 20, further comprising the step of:

activating at least one transistor according to one of either a logic signal, based on the data item, or the clock signal, to reduce noise sensitivity of the first and second structures.

22. A D flip-flop circuit, comprising:

a first latch structure and a second latch structure, each having:

a first pair of transistors, each transistor of said first pair of transistors being of a first type, having a gate terminal connected to a respective drain terminal of another transistor of said first pair of transistors; and a second pair of transistors, each transistor of said second pair of transistors being of a second type, having a gate terminal connected to a respective drain terminal of another transistor of said second pair of transistors and wherein each drain terminal of said first pair of transistors is connected to a respective drain terminal of said second pair of transistors;

a master section interposed between a first voltage potential and a second voltage potential including:

said first latch structure, wherein said first pair of transistors has source terminals connected to said first voltage potential;

a master latch coupler having a third pair of transistors, each transistor of said third pair of transistors being of said second type, having a drain terminal connected to a respective source terminal of said second pair of transistors of said first latch structure, a source terminal connected to said second voltage potential and a gate terminal that receives a single clock signal; and an input coupler having two pair of transistors, each transistor of each pair of transistors being of said first type, each pair of transistors including a first transistor and a second transistor connected in series, wherein a source terminal of said first transistor is connected to said first voltage potential, a drain terminal of said second transistor is connected to a respective drain terminal of said first pair of transistors of said first latch structure, and wherein a gate terminal of said first transistor receives said single clock signal, and a gate terminal of one of said second transistors receives a logic level input signal and a gate terminal of another of said second transistors receives a complement of said logic level input signal;

a slave section interposed between said first voltage potential and said second voltage potential including:

said second latch structure wherein said first pair of transistors has source terminals connected to said first voltage potential and said second pair of transistors has source terminals connected to said second voltage potential; and a slave coupler having two pair of transistors, each transistor of each pair of transistors being of said second type, each pair of transistors being series connected between said second voltage potential and a respective drain terminal of said first pair of transistors of said second latch structure, wherein a gate terminal of one transistor in each pair of transistors is connected to a respective drain terminal of said first pair of transistors of said first latch structure, and a gate terminal of another transistor in each pair of transistors receives said single clock signal;

a first set transistor of said second type having a source terminal connected to said second voltage potential, and a drain terminal connected to a first drain terminal of said first pair of transistors of said first latch structure;

a second set transistor of said second type having a source terminal connected to said second voltage potential, and a drain terminal connected to a first drain terminal of said first pair of transistors of said second latch structure;

a first clear transistor of said second type having a source terminal connected to said second voltage potential, and a drain terminal connected to a second drain terminal of said first pair of transistors of said first latch structure; and a second clear transistor of said second type having a source terminal connected to said second voltage potential, and a drain terminal connected to a second drain terminal of said first pair of transistors of said second latch structure, wherein:

each of the first and second set transistors further includes a gate terminal that receives a complement of a set signal;

said gate terminal of one of said second transistors in said input coupler receives, instead of said complement of said logic level input signal, a first data signal resulting from a first logic NAND operation on said logic level input signal and a clear signal;

said gate terminal of another of said second transistors in said input coupler receives, instead of said logic level input signal, a second data signal resulting from a second logic NAND operation on said first data signal and said set signal; and each of said first and second clear transistors further includes a gate terminal that receives a complement of said clear signal.

23. The D flip-flop circuit according to claim 22, wherein:
said first type is a P-channel MOS transistor;
said second type is an N-channel MOS transistor;
said first voltage potential is a power supply line; and
said second voltage potential is a ground potential.

24. The D flip-flop circuit according to claim 22, wherein each of said second transistors of said input coupler has a large source area, whereby a stray capacitance with respect to said second voltage potential at a source terminal of said second transistor is greater than a capacitance at the respective drain terminal of said first pair of transistors of said first latch structure.

25. A D flip-flop circuit, comprising:
a first latch structure and a second latch structure, each having:
a first pair of transistors, each transistor of said first pair of transistors being of a first type, having a gate terminal connected to a respective drain terminal of another transistor of said first pair of transistors; and
a second pair of transistors, each transistor of said second pair of transistors being of a second type, having a gate terminal connected to a respective drain terminal of another transistor of said second pair of transistors and wherein each drain terminal of said first pair of transistors is connected to a respective drain terminal of said second pair of transistors;
a master section interposed between a first voltage potential and a second voltage potential including:
said first latch structure, wherein said first pair of transistors has source terminals connected to said first voltage potential;
a master latch coupler having a third pair of transistors, each transistor of said third pair of transistors being of said second type, having a drain terminal connected to a respective source terminal of said second pair of transistors of said first latch structure, a source terminal connected to said second voltage potential and a gate terminal that receives a single clock signal; and an input coupler having two pair of transistors, each transistor of each pair of transistors being of said first type, each pair of transistors including a first transistor and a second transistor connected in series, wherein a source terminal of said first transistor is connected to said first voltage potential, a drain terminal of said second transistor is connected to a respective drain terminal of said first pair of transistors of said first latch structure, and wherein a gate terminal of said first transistor receives said single clock signal, and a gate terminal of one of said second transistors receives a logic level input signal and a gate terminal of another of said second transistors receives a complement of said logic level input signal;

a slave section interposed between said first voltage potential and said second voltage potential including:
said second latch structure wherein said first pair of transistors has source terminals connected to said first voltage potential and said second pair of transistors has source terminals connected to said second voltage potential; and
a slave coupler having two pair of transistors, each transistor of each pair of transistors being of said second type, each pair of transistors being series connected between said second voltage potential and a respective drain terminal of said first pair of transistors of said second latch structure, wherein a gate terminal of one transistor in each pair of transistors is connected to a respective drain terminal of said first pair of transistors of said first latch structure, and a gate terminal of another transistor in each pair of transistors receives said single clock signal;

a DCS transistor of said second type having a source terminal connected to said second voltage potential and a drain terminal connected to one drain terminal of said third pair of transistors of said master section;

a DCR transistor of said second type having a source terminal connected to said second voltage potential and a drain terminal connected to another drain terminal of said third pair of transistors of said master section;

a set transistor of said second type having a drain terminal connected to one drain terminal of said first pair of transistors of said second latch structure and a source terminal connected to said second voltage potential; and a clear transistor of said second type having a drain terminal connected to another drain terminal of said first pair of transistors of said second latch structure and a source terminal connected to said second voltage potential, wherein:

a gate terminal of said DCS transistor and said gate terminal of one of said second transistors in said input coupler each receive a second logic signal derived by a series of a first and a second logic NAND operation, a first logic signal resulting from the first logic NAND operation on the logic level input signal and a clear signal, and the second logic signal resulting from the second logic NAND operation on the first logic signal and a set signal;

a gate terminal of said DCR transistor and said gate terminal of another of said second transistors in said input coupler each receive a complement of said second logic signal;

a gate terminal of said set transistor receives a complement of said set signal; and a gate terminal of said clear transistor receives a complement of said clear signal.

26. The D flip-flop circuit according to claim 25, wherein each of said second transistors of said input coupler has a large source area, whereby a stray capacitance with respect to said second voltage potential at a source terminal of said second transistor is greater than a capacitance at the respective drain terminal of said first pair of transistors of said first latch structure.

27. The D flip-flop circuit according to claim 25, wherein:

said first type is a P-channel MOS transistor;

said second type is an N-channel MOS transistor;

said first voltage potential is a power supply line; and said second voltage potential is a ground potential.

\* \* \* \* \*

UNITED STATES PATENT AND TRADEMARK OFFICE
CERTIFICATE OF CORRECTION

PATENT NO. : 5,821,791

DATED : October 13, 1998

INVENTOR(S): Maurizio Gaibotti and Francesco Adduci

It is certified that error appears in the above-identified patent and that said Letters Patent is hereby corrected as shown below:

Column 2, line 58, change "invertors" to --inverters--.
Column 5, line 63, change "100" to --101--.

Signed and Sealed this

Twenty-third Day of February, 1999

Attest:

Q. TODD DICKINSON

*Attesting Officer*    *Acting Commissioner of Patents and Trademarks*